United States Patent [19]

Washburn

[11] 4,300,209
[45] Nov. 10, 1981

[54] METHOD FOR ADJUSTING SIGNAL LEVEL OUTPUT FROM A MAGNETIC BUBBLE DETECTOR

[75] Inventor: Hudson A. Washburn, Santa Clara, Calif.

[73] Assignee: Intel Magnetics, Inc., Santa Clara, Calif.

[21] Appl. No.: 163,574

[22] Filed: Jun. 27, 1980

[51] Int. Cl.³ .............................................. G11C 19/08
[52] U.S. Cl. .............................................. 365/8; 365/1
[58] Field of Search ........................ 365/8, 1; 335/195

[56] References Cited

U.S. PATENT DOCUMENTS

| 4,035,785 | 7/1977 | Kryder | 365/8 |
| 4,078,230 | 3/1978 | George | 365/8 |
| 4,146,867 | 3/1979 | Blangearo et al. | 338/195 |
| 4,150,366 | 4/1979 | Price | 338/195 |

*Primary Examiner*—James W. Moffitt
*Attorney, Agent, or Firm*—Blakely, Sokoloff, Taylor & Zafman

[57] ABSTRACT

A method for adjusting output signal levels from a magnetic bubble detector. Portions of the chevron stacks located adjacent to either the detector element or dummy element are selectively removed. This removal changes the magnetic field at either one of these elements, thereby adjusting the detector output. This removal may be performed with laser trimming techniques or by etching.

16 Claims, 3 Drawing Figures

METHOD FOR ADJUSTING SIGNAL LEVEL OUTPUT FROM A MAGNETIC BUBBLE DETECTOR

BACKGROUND OF THE INVENTION

1. Field of the Invention:

The invention relates to the field of magnetic bubbles and particularly to detectors of magnetic bubbles.

2. Prior Art:

In single wall domain (magnetic bubble) devices, such as bubble memories, detectors are used to sense magnetic bubbles. Most frequently, a magnetic bubble is expanded and then propagated through a magnetoresistive element. The resistance change of this element caused by the expanded bubble is detected.

Often bubble detectors include a detector element and a dummy element. The signal from the dummy element is used as a reference in a bridge network. The effects of the rotating magnetic field on these two elements ideally provides a null or zero signal with no magnetic bubble at the detector element, and a signal (e.g. 6 mvolts) when a bubble is at the detector element. One arrangement where the output of two detectors is used in a single Wheatstone bridge is described in "Megabit Bubble-Memory Chip Gets Support from LSI Family" *Electronics*, Apr. 26, 1979, beginning on p. 105. Also see copending application, Ser. No. 65,361 filed Aug. 8, 1979 entitled "MAGNETIC BUBBLE DETECTOR" assigned to the assignee of the present invention.

One problem which has consistently plagued fabricators of magnetic bubbles is that the signal output of the magnetoresistive elements varies from wafer-to-wafer because of process variations. In some instances instead of a "zero" signal level with no bubble present the detector output is, for example, 2 mV signal level. The presence of this signal interferes with the reliable detection of bubbles.

To overcome this problem, a number of steps have been taken. In some instances, if the detector output is not within predetermined limits, the memory is not used. Obviously, this reduces yields. In other instances, sense amplifiers which are more tolerant to signal shape or level variations are used. This circuitry is more costly and not ideal for production memories. The matching of particular devices with particular sense amplifiers is also used. This method has the obvious objection of being time consuming and is not a viable manufacturing technique.

As will be seen, the present invention provides a method for adjusting the output from a bubble detector to provide a true null or zero level, or any desired signal level. The method lends itself to high production fabrication.

SUMMARY OF THE INVENTION

The described method is used in a magnetic apparatus which includes a layer of material in which single wall domains are moved in response to a changing magnetic field. Typically, this apparatus includes a layer of magnetic elements including a detector element for detecting an expanded domain, and elements adjacent to the detector element for propagating domains into and from the detector element. The invented method for adjusting the signal level comprises the removal of selected portions of at least one of the elements adjacent to the detector element. This removal changes the magnetic field at the detector element, thereby changing the output signal from the detector. This removal produces a signal at the detector which tends towards the opposite polarity from the signal produced by a bubble.

The bubble detectors generally have a "dummy" element and additional elements disposed adjacent to the dummy element. These adjacent element are used to assure a field at the dummy element which is the same as the field at the active detector element. Portions of the elements adjacent to the dummy element may be removed to adjust the output level from the detector. Removal of portions of these elements provides a signal which tends to look more like a bubble signal when the dummy element is used in a bridge circuit with the active detector element.

DESCRIPTION DESCRIPTION OF THE INVENTION

A method is described for adjusting the output of a magnetic bubble detector. In the following description, numerous specific details are set forth to provide a thorough understanding of the present invention, for example, the present invention is described with reference to a particular prior art detector which has two detector elements. It will be obvious to one skilled in the art, however, that the present invention may be practiced without these details, for example, with a detector with one detector element. In other instances, well-known circuits and processing steps are not described in detail in order not to obscure the present invention in unnecessary detail.

Figure 2:
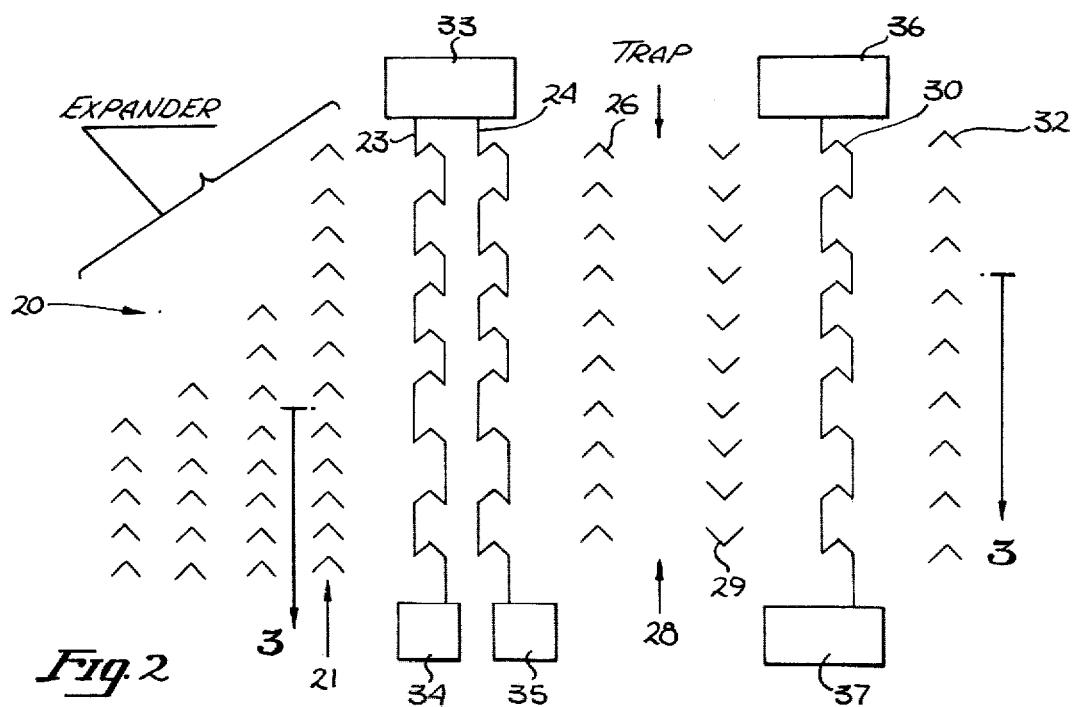
FIG. 2 is a plan view of a prior art bubble detector.

Referring first to FIG. 2, the prior art detector includes an expander section 20; the chevron stacks in this expander are progressively longer in the direction of the bubble propagation, although other configurations of expanders may be used. Thus, as a bubble is propagated along the expander, it is expanded. For the described detector, there are a plurality of chevron stacks 21, which form a lead-in section between the expander and the detector elements. The described detector includes two detector elements, although only one is actually used. (One element is left unconnected and acts as an ordinary propagation element, the other element is electrically coupled into a circuit, and hence hereafter is referred to as the "active" detector element.) Both the detector elements 23 and 24 consist of interconnected chevrons. One end of these detector elements are coupled to a pad 33; the other end of element 23 is coupled to pad 34 and the other end of element 24 to pad 35. After a bubble is propagated through the detector elements, it is propagated through other stacks, such as stacks 26 into a trap 28. The reverse orientation of the chevrons within the stack 29, along with stack 26 define the trap.

The detector includes a dummy detector element 30 which is coupled between pads 36 and 37. Again, this element comprises a plurality of interconnected chevrons. A plurality of other stacks 32 are disposed on the side of the dummy element 30 opposite stack 29. These stacks are not used for the propagation of bubbles, but rather to assure that the inplane rotating magnetic field is the same at the dummy element 30 as at the detector element.

The detector of FIG. 2, in the presently preferred mebodiment, is fabricated in a permalloy layer using well-known photolithographic techniques. For a more complete discussion of this particular prior art detector, see copending application Ser. No. 65,361 filed Aug. 9, 1979 and assigned to the assignee of the present application.

In practice, the dummy elements 30 provides a reference level signal which is, in effect, compared to the signal from the active detector element 23 or 24 in a Wheatstone bridge arrangement. If no bubble is present at the active detector element, the effects of the rotating magnetic field on this element are cancelled by the signal from the dummy element. Ideally, a "zero" signal level or output should occur from the bridge with no bubble at the active detector. However, because of process variations, a zero signal level is seldom achieved. Signal levels of 2 mV instead of the zero signal are common, making it more difficult to sense a bubble at the element. (For the described detector the signal from the bubble is approximately 6 mV).

Figure 3:
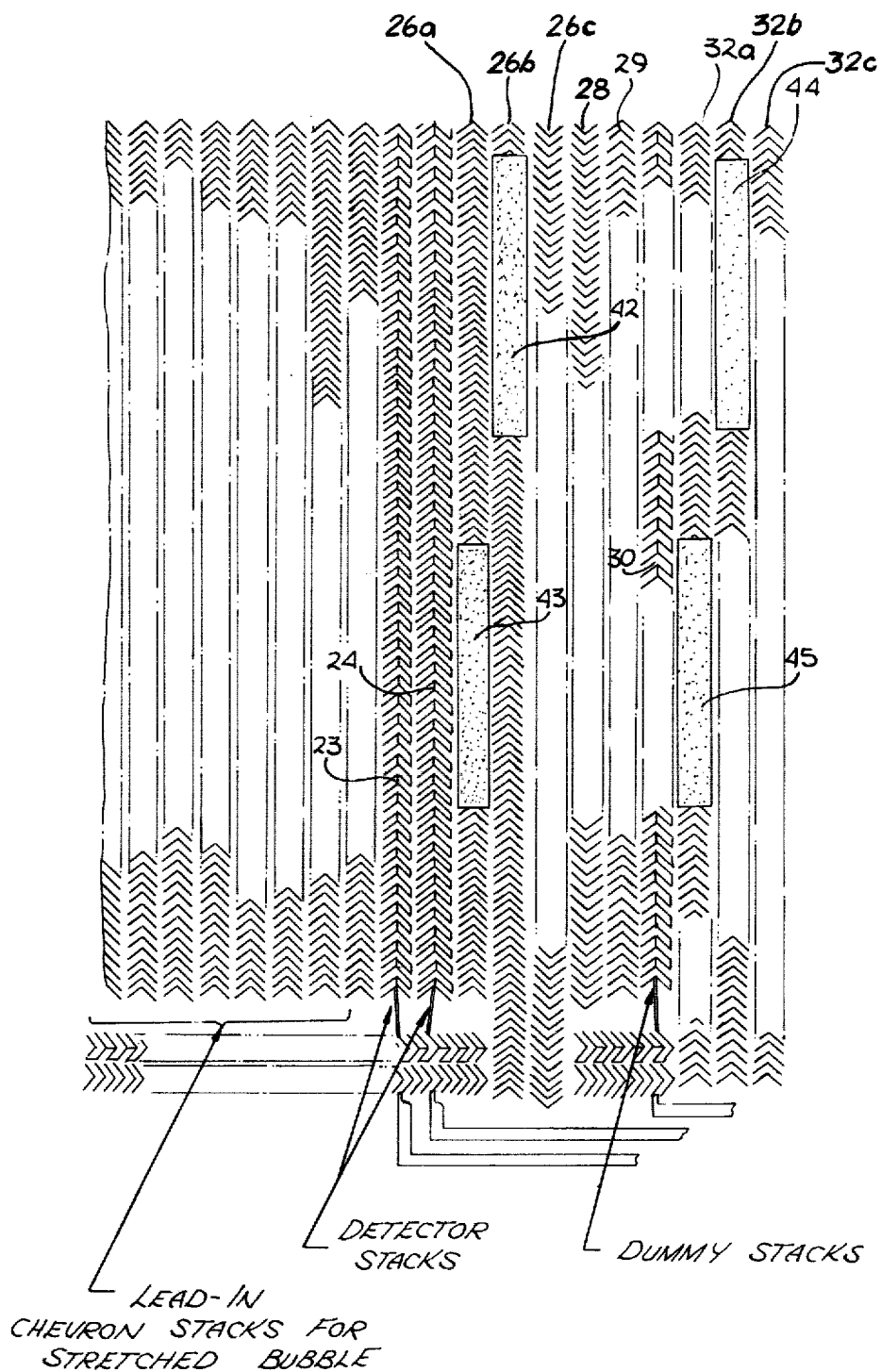
FIG. 3 is an expanded view of a portion of the detector of FIG. 2, with portions of elements removed to illustrate the present invention. This view is taken generally through section lines 3—3 of FIG. 2.

Referring now to FIG. 3, in the expanded portion of the detector of FIG. 2, the lead-in stack 21 of FIG. 2 is shown as a plurality of chevron stacks, all of which are to the left of the detector elements 23 and 24. To the right of the detector elements are other adjacent propagation stacks (such as stacks 26a, 26b and 26c) which direct the bubbles from the detector elements 23 and 24 into the trap 28. Three stacks of chevrons 32a, 32b, and 32c are shown to the right of dummy element 30. As mentioned, these stacks do not propagate bubbles, but rather insure a certain field at the dummy element 30.

With the present invention, after the detector has been fabricated, the signal level from the active detector element (either element 23 or 24) and the signal level from the dummy element 30, caused by the rotating magnetic field, are sensed. The sensing is done, in the presently preferred embodiment, without the presence of bubbles. If the signal levels from the active detector element and dummy element are equal, no adjustment is necessary. Since typically a zero signal level does not result, an adjustment in accordance with the present invention is made. Portions of the chevron stacks adjacent to either the detector elements 23 or 24 are removed if the offset is in one direction. That is, as shown in FIG. 3, chevrons from area 43 of stack 26a and/or area 42 of stack 26b are removed. If the offset is in the other direction, chevrons from the stacks to the right of the dummy element 30 are removed. For example, chevrons are removed from area 45 of stack 32a and/or area 44 of stack 32b. As will be described, the chevrons may be removed either by etching or by trimming (evaporating) with a laser beam.

Assume for sake of discussion it is determined that an adjusted signal which tends towards the opposite polarity from the signal produced by a bubble is necessary. This requires that chevrons be removed from stacks adjacent to the detector elements 23 or 24. (It is preferred that chevrons be removed from the stacks to the right of the detector elements rather than in the lead-in chevron stacks. The reason for this is that maintaining expanded bubble integrity to the right of the detector elements leading into the trap is not critical.)

Removal of chevrons in the stacks adjacent to the detector elements changes the magnetic coupling in the region of the active detector element itself, thereby providing the described result. In general, this change in coupling varies inversely as the distance from the removed chevrons. Removal of chevrons as indicated at area 43 of stack 26a has a more profound effect on output level than removal of chevrons from area 42 of stack 26b. Thus, removal of chevrons from area 43 is used for more major adjustments, while removal from area 42 provides for "fine tuning". The number of chevrons which are removed and the stack from which they are removed is, of course, a function of the detector geometry and many other parameters and is best determined empirically.

The removal of the chevrons as shown above has only a second order effect on the bubble itself and thus does not significantly affect the performance of the detector element. If the offset is in the other direction, as mentioned, chevrons are removed from areas 44 and 45. This results in a signal adjustment in the direction of the signal generated by a bubble. Once again, finer adjustments are made by removing chevrons further away from the dummy element such as shown by area 44 of stack 32b and coarser adjustments are made closer to the dummy element 30 by removal of chevrons from area 45 of stack 32a.

Figure 1:
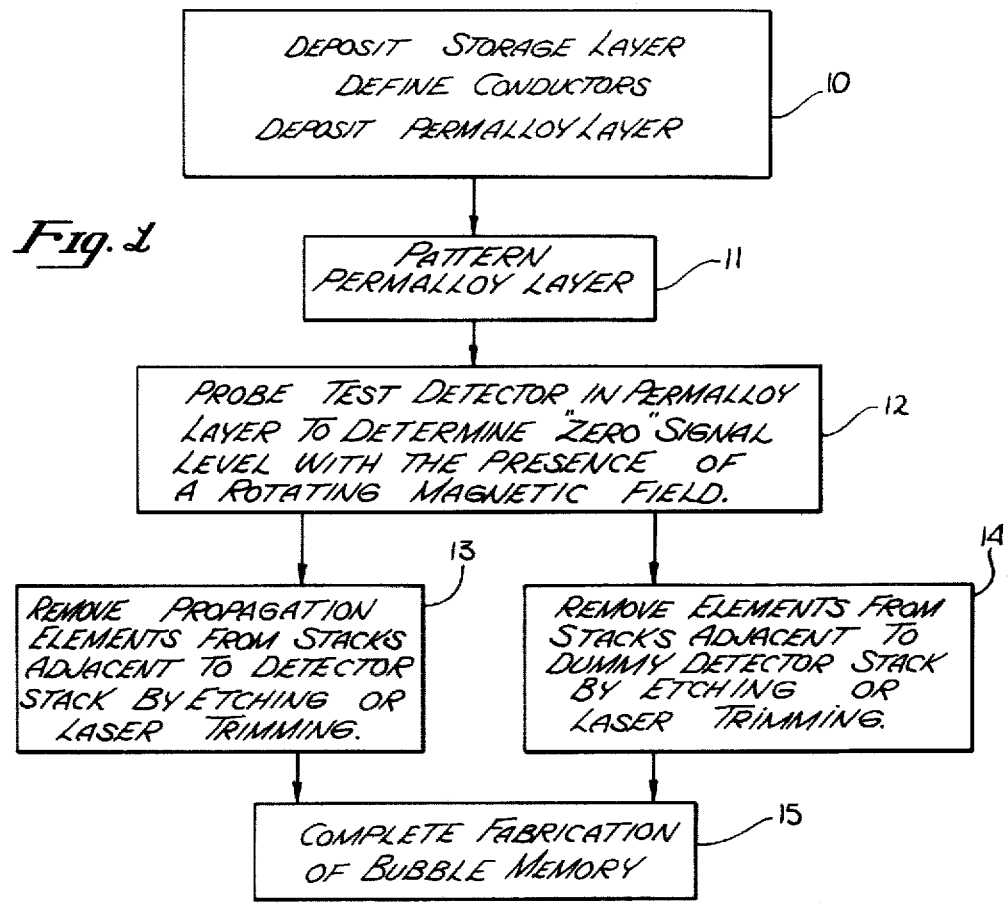
FIG. 1 describes the method of the present invention in a flow diagram consisting of a series of blocks.

Referring now to block 10 of FIG. 1, in the typical fabrication of a bubble memory, a storage layer of garnet is formed on a substrate. Then, conductors are formed insulated from the storage layer. Following the formation of an insulative layer over the conductors, a layer of magnetic material, such as permalloy is formed.

Next, as indicated by block 11, through well-known photolithograhpic techniques, patterns are formed in the permalloy layer. This includes the fabrication of the bubble detectors such as the detectors shown in FIG. 2.

In the presently preferred method, at this point in the processing, the detector element and dummy element of each detector are tested in the presence of the rotating magnetic field. A probe tester may be used as indicated by block 12. The results of this testing determines whether chevrons are to be removed from stacks adjacent to the detector element dummy element (block 14) in the other case. As mentioned, these chevrons may be removed with an etchant as will be described, or with a laser beam.

Following this, as indicated by block 15, the fabrication of the bubble memory is completed with ordinary steps. For example, a protective layer is placed over the permalloy layer and contacts, etc. are formed.

A "built-in" imbalance between the signal levels from the detector element and dummy element can be used to insure removal of chevrons in one location only. For example, if more chevron stacks are placed near the dummy elements than near the detector elements, then all trimming can take place in the stacks adjacent to the dummy elements. An offset in a given direction can always be assured with other techniques such as by using a different structure for the dummy detector elements when compared to the active detector elements.

Well-known processing steps can be used to remove portions of the chevron stacks. For example, a silicon oxide layer is formed over the chevron elements. Then, using photoresist and a mask, openings are etched through the silicon oxide at the areas where the chevrons are to be removed. Then with an ordinary etchant, the chevrons are removed.

Alternatively, the chevrons can be removed through evaporation by using a laser beam. Well-known laser trimming techniques, including automated laser trimmers, used for adjusting resistors, can be used.

Ordinary masks may be used to isolate the areas from which chevrons are to be removed. In practice, all the detectors on a given wafer require approximately the same amount of adjustment. That is to say, the process variations are minor across a given wafer. Since this is the case, several sets of masks may be developed each of which provides a uniform adjustment across a wafer. With relatively few masks, the signal levels from the detectors may be adjusted in production fabrication.

While presently, etching or laser trimming are preferred, it is possible in some cases to remove chevrons by passing a high electrical current through them and, in effect, burning them off. Also, while in the presently preferred embodiment, entire chevrons are removed, the same result can be obtained by only removing portions of chevrons or elements other than chevrons.

Thus, a method has been described for adjusting the output from a magnetic bubble detector. Chevrons are removed by etching or laser trimming from stacks adjacent to either the active detector element or the dummy element. This provides the desired adjustment without significant affecting the performance of the detector.

I claim:

1. In a magnetic apparatus which includes a layer of material in which single wall domains are moved in response to a changing magnetic field, and a layer of magnetic elements including a detector element for detecting an expanded domain, and other elements adjacent to said detector element for propagating domains into and from said detector element, a method for adjusting the signal level to a predetermined level from said detector element comprising the step of:

removing a selected portion of at least one of said other elements;

whereby the effect of said changing magnetic field on said detector element is altered by said removing of said portion of said other element, thereby providing said adjustment of said signal level.

2. The method defined by claim 1 wherein said removing is performed by etching.

3. The method defined by claim 1 wherein said removing is performed by laser trimming.

4. The method defined by claim 1 wherein a domain trap is disposed between said detector element and a dummy detector element, and wherein said removing of said selected portion of said other element occurs on an element disposed between said detector element and said dummy element.

5. The method defined by claim 1 wherein said other elements adjacent to said detector element comprise a plurality of chevrons and wherein said removing comprises removal of a predetermined number of said chevrons.

6. In a magnetic apparatus which includes a layer of material in which single wall domains are moved in response to a changing magnetic field, and a layer of magnetic elements, including a detector element for detecting expanded domain, a lead-in element for propagating said expanded domain into said detector element, a domain trap for receiving domains from said detector element, a dummy element and a plurality of other elements disposed adjacent to said dummy element for assuring that said changing magnetic field is relatively constant at both said detector and dummy elements and wherein the signal from said detector element is referenced to the signal from said dummy element, to provide a third signal, a method for adjusting the level of said third signal to a predetermined level comprising the step of:

removing a selected portion of at least one of said other elements;

whereby the effect of said changing magnetic field on said dummy element is altered by said removing of said portion of said other element, thereby providing said adjustment of said third signal level.

7. The method defined in claim 6 wherein said removing is performed by etching.

8. The method defined by claim 6 wherein said removing is performed by laser trimming.

9. In the fabrication of a bubble memory, which includes a magnetic layer patterned to defined predetermined structures, including a detector for sensing an expanded bubble, said detector comprising a detector stack and adjacent propagation stacks for moving bubbles into and from said detector stack, a method for obtaining a predetermined signal level from said detector stack when said memory is subjected to a rotating magnetic field comprising the steps of:

applying said rotating magnetic field;

sensing the output signal of said detector; and removing a portion of at least one of said adjacent stacks so as to obtain said predetermined signal level;

whereby said detector output is readily matched to a sense amplifier.

10. The method defined by claim 9 wherein said removing is performed by etching.

11. The method defined by claim 9 wherein said removing is performed by laser trimming.

12. The method defined by claim 9 wherein said adjacent propagation stacks comprise permalloy chevrons and said removing comprises removal of a plurality of said chevrons.

13. In the fabrication of a bubble memory, which includes a magnetic layer patterned to define predetermined structures, including a detector for sensing an expanded bubble, said detector comprising a detector stack, a dummy stack for providing a reference signal and a plurality of other stacks adjacent to said dummy stack for causing a rotating magnetic field to be relatively constant at both said detector and dummy stacks, a method for obtaining a predetermined signal level from said dummy stack when said memory is subjected to said rotating magnetic field comprising the steps of:

applying said rotating magnetic field;

sensing said signal from said detector; and removing portions of at least one of said other stacks so as to obtain said predetermined signal level;

whereby said detector output is readily matched to a sense amplifier.

14. The method defined by claim 13 wherein said removing is performed by etching.

15. The method defined by claim 13 wherein said removing is performed by laser trimming.

16. The method defined by claim 13 wherein said other stacks comprise permalloy chevrons and said removing comprises removal of a plurality of said chevrons.

* * * * *